(12) United States Patent
Kim et al.

(10) Patent No.: US 6,603,272 B2
(45) Date of Patent: Aug. 5, 2003

(54) ROSEN TYPE PIEZOELECTRIC TRANSFORMER WITH MULTIPLE OUTPUT ELECTRODES, AND STABILIZER FOR MULTIPLE LIGHT SOURCE USING THAT

(75) Inventors: Jong-Sun Kim, Kyungki-do (KR); Jang-Hyoun Youm, Kyungki-do (KR)

(73) Assignee: Samsung Electro-Mechanics Co., Ltd., Kyungki-do (KR)

( * ) Notice: Subject to any disclaimer, the term of this patent is extended or adjusted under 35 U.S.C. 154(b) by 0 days.

(21) Appl. No.: 10/251,330

(22) Filed: Sep. 20, 2002

(65) Prior Publication Data

US 2003/0015943 A1 Jan. 23, 2003

Related U.S. Application Data

(62) Division of application No. 09/894,452, filed on Jun. 28, 2001.

(51) Int. Cl.[7] .......................... H05B 41/16; H01L 41/06
(52) U.S. Cl. ................... 315/209 PZ; 310/359
(58) Field of Search .................. 315/209 PZ, 276, 315/209 R, 55–60; 310/311, 359, 321, 367, 366

(56) References Cited

U.S. PATENT DOCUMENTS

| | | | |
|---|---|---|---|
| 5,856,728 A | * 1/1999 | Zimnicki et al. | 315/209 PZ |
| 5,892,318 A | 4/1999 | Dai et al. | 310/358 |
| 6,051,915 A | * 4/2000 | Katsuno et al. | 310/359 |
| 6,188,163 B1 | * 2/2001 | Danov | 310/366 |
| 6,509,699 B2 | * 1/2003 | Kim et al. | 315/291 |

* cited by examiner

Primary Examiner—Don Wong
Assistant Examiner—Minh D A
(74) Attorney, Agent, or Firm—Renner, Otto, Boisselle & Sklar, LLP

(57) ABSTRACT

The present invention is disclosed a piezoelectric transformer with multiple outputs for lighting a plurality of cold cathode fluorescent lamps at the same time by forming a plurality of output electrodes as one body and a stabilizer having the piezoelectric transformer with multiple output electrodes. The piezoelectric transformer includes a piezoelectric plate; an input electrode formed on an upper surface of the plate; a plurality of output electrodes having an identical band shape, arranged in equal distance in the longitudinal direction of the plate at an outer side of the input electrode, and connected electrically to one ends of the plurality of the cold cathode fluorescent lamps respectively; and a common electrode formed on a bottom surface of the plate, confronting to the input electrode, commonly connected to ground of the stabilizer and other ends of the plurality of the cold cathode fluorescent lamps.

1 Claim, 9 Drawing Sheets

ROSEN TYPE PIEZOELECTRIC TRANSFORMER WITH MULTIPLE OUTPUT ELECTRODES, AND STABILIZER FOR MULTIPLE LIGHT SOURCE USING THAT

This application is a divisional of U.S. patent application Ser. No. 09/894,452 filed on Jun. 28, 2001, which is hereby incorporated herein by reference in its entirety.

BACKGROUND OF THE INVENTION

1. Field of the Invention

The present invention relates to Rosen type Piezoelectric Transformer constituting a stabilizer for cold cathode fluorescent lamp being used for back light of liquid crystal display (LCD) device, more particularly, to a Rosen type Piezoelectric Transformer with multiple output electrodes for lighting a plurality of cold cathode fluorescent lamp at the same time by forming multiple output electrodes as one body and a stabilizer for multiple light source using that.

2. Description of the Prior Art

As well known to those skilled in the art, a fluorescent lamp needs high voltage at initial lighting in order to emit required thermal electrons for an electric discharge. And, after electric discharge, the voltage impressed on the fluorescent lamp has negative resistance characteristics reduced when lamp current increases.

Especially, a cold cathode fluorescent lamp being used for backlight of liquid crystal display (LCD) device is light source using cold emission (electron emission caused by forcing strong electric field to cathode surface). In order to light the Backlight comprised of the cold cathode fluorescent lamp, it needs about 500 V need. And, generally, a step-up transformer is used for convert the commercial AC power source to the driving voltage.

The stabilizer is a lamp lighting device applying the driving voltage for lighting on the fluorescent lamp with properties mentioned above, and comprises, as shown in FIG. 6, rectifying section 621 which rectifies AC commercial source 61 to DC voltage in some level, power factor compensation section 622 compensating for the power factor caused by the fluctuation of AC commercial voltage source in respect of the output voltage of the rectifying section 621, AC voltage generating section 623 converting the DC voltage inputted through the power factor compensation section 622 to proposed AC voltage of high frequency, and a resonating section 624 for resonating with the output voltage of a AC voltage generating section 623 and supplying the AC voltage on the fluorescent lamp 63.

As above-mentioned, AC voltage generating section 623 is called an inverter.

And, said resonating section 624 is conventionally constructed to generate the resonance by the inductance of the winding type transformer and the capacitance of a resonance capacitor with connection of the winding type transformer. But the winding type transformer has some problems that the rate of producing poor quality is high and the credibility of the stabilizer is reduced because the deviation of the quality of core is excessive, so said winding type transformer is recently replaced with a piezoelectric transformer such that the resonance is generated by the inductance of the inductor with the capacitance of the piezoelectric transformer.

But the above statement is the case of connecting one fluorescent lamp to one stabilizer. On the other hand, in case of lighting more than two fluorescent lamps by connecting the fluorescent lamps into one stabilizer, if one of numerous fluorescent lamps is lighted, other fluorescent lamps connected to the wound-type transformer in parallel is not lighted because a lower voltage is supplied to the other fluorescent lamps by lighting the one fluorescent lamp.

Accordingly, in the case of connecting two or more fluorescent lamps to the one stabilizer, as shown in FIGS. 8 and 9, the ballast capacitor is directly connected between fluorescent lamps 72, 82 and transformers 712, 812 such that the voltage required for initial lightening is impressed on the fluorescent lamp even if a certain fluorescent lamp is lighted ahead.

Hence, the conventional stabilizer used for a plurality of light sources is constructed as shown in FIGS. 8 and 9.

As shown in FIG. 8, the stabilizer comprises a circuit section 711, which includes the rectifying section 621, the power compensating section 622, the AC voltage generating section 623, and the resonance capacitor of the resonating section 624, the piezoelectric transformer 712 of which input electrode is connected to the resonance capacitor of the circuit section 711, and a plurality of ballast capacitors 713 being connected to output electrode of the piezoelectric transformer 712 in parallel. Wherein the number of ballast capacitors is same that of lamps. Furthermore, a plurality of fluorescent lamps 72 is connected to other terminal of the plurality of ballast capacitors 713 of the stabilizer 71 respectively.

As shown in FIG. 9, the stabilizer for a plurality of fluorescent lamps having a wound-type transformer comprises a circuit section 811, which includes the rectifying section 621, the power compensating section 622, the AC voltage generating section 623, and the resonance capacitor of the resonating section 624. And the stabilizer comprises the wound-type transformer 812 of which input electrode is connected to a resonance capacitor of the circuit section 811, and a plurality of ballast capacitors 813 being connected to output electrode of the wound-type transformer 812 in parallel. Furthermore, the plurality of fluorescent lamps 82 is connected to other terminal of the plurality of ballast capacitors 713 of the stabilizer 71 respectively.

In the stabilizer above, because AC voltage supplied by the wound-type transformer 712 or the piezoelectric transformer 812 is divided equally among the plurality of fluorescent lamps via the ballast capacitor 713,813, the plurality of fluorescent lamps can be lighted at the same time. Wherein the ballast capacitor 713,813 has a high withstand voltage characteristic, and its size is also big.

Accordingly, as shown in FIG. 7 or FIG. 8, because the stabilizer needs the ballast capacitors in proportion to the number of the connected fluorescent lamp, a volume and the number of components increase, and a cost increases also.

Thus, in the case of constituting a stabilizer as mentioned above, there have been some problems that numbers of components and the volume increase and the production cost rise because a ballast capacitor is required proportion to numbers of connected fluorescent lamp.

SUMMARY OF THE INVENTION

Accordingly, an object of the present invention is to provide a Rosen type piezoelectric transformer having a plurality of output electrodes with uniform output property which makes the fluorescent lamp light stably, the operation be simple, and the cost be reduced. The present invention provides a Rosen type Piezoelectric Transformer with multiple output electrodes, being used for a stabilizer to light a plurality of cold cathode fluorescent lamps, comprising: a piezoelectric plate; an input electrode formed at an upper surface of the plate; a plurality of output electrodes having an identical band shape, arranged in equal distance in the longitudinal direction of the plate at an outer side of the input electrode, and connected electrically to one ends of the plurality of the cold cathode fluorescent lamps respectively; and a common electrode formed at a bottom surface of the plate, confronting to the input electrode, commonly connected to ground of the stabilizer and other ends of the plurality of the cold cathode fluorescent lamps.

BRIEF DESCRIPTION OF THE DRAWINGS

The above and other objects, features and other advantages of the present invention will be more clearly understood from the following detailed description taken in conjunction with the accompanying drawings, in which:

FIG. 5 shows a perspective view of a Rosen type Piezoelectric Transformer in accordance with another embodiment of the present invention and a stabilizer for a plurality of lamps applying that;

DETAILED DESCRIPTION OF THE INVENTION

Figure 1:
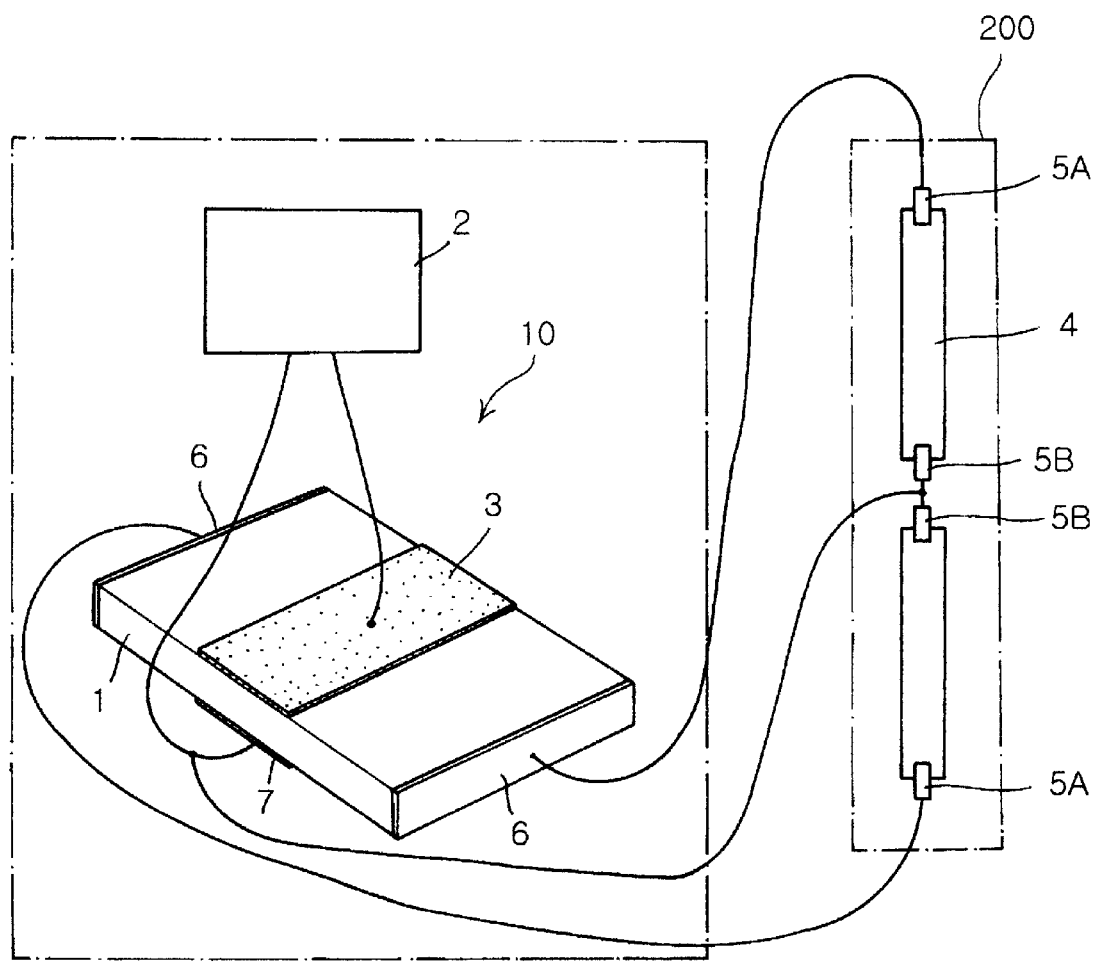
FIG. 1 shows a perspective view of a stabilizer for a plurality of lamps having a Rosen type Piezoelectric Transformer in accordance with the primary embodiment of the present invention.

Reference now should be made to the drawings, in which the same reference numerals are used throughout the different drawings to designate the same or similar components.

FIG. 1 shows a view of an embodiment of a piezoelectric transformer and a stabilizer using the piezoelectric transformer, in this embodiment the 2 light sources is used.

As shown in FIG. 1, a Rozen type piezoelectric transformer 10 comprises an input electrode 3 formed at the center of the upper surface of the piezoelectric plate 1 in the longitudinal direction of the plate and connected to a circuit section 2 of a stabilizer 100, a common electrode 7 formed on the bottom surface of the piezoelectric plate 1 opposed to the input electrode 3, and two output electrodes 6 formed on the both confronting side surface in the longitudinal direction of the plate 1.

And, the input electrode 3 and the common electrode 7 are connected to an output of the circuit section 2 in the stabilizer 100, the two output electrode 6 is respectively connected to one ends of two cold cathode fluorescent lamps 4 of a lamp section 200, and the other ends of two cold cathode fluorescent lamps 4 is connected to the common electrode 7. That is, two cold cathode fluorescent lamps 4 are connected to the piezoelectric transformer 10 in parallel.

As described above, the circuit section 2 converts the commercial voltage source of 220 V or 110 V with AC voltage of a predetermined voltage level and frequency. And then the AC voltage is impressed the input electrode 3 and the common electrode 7. As result, it brings about a longitudinal vibration. The longitudinal vibration is transmitted the output electrodes 6, and then a AC voltage outputs between the output electrodes 6 and the common electrode 7. The AC voltage outputted the output electrodes 6 is related to the distance to the input electrode 3 and the thickness of the piezoelectric plate 1, and the output electrodes 6 placed on the confronting side surface has the same output property because each of the output electrodes 6 has the same condition. Thus, the uniform voltage is impressed to two cold cathode fluorescent lamps 4 such that all of the fluorescent lamp 4 can be lighted.

Figure 2:
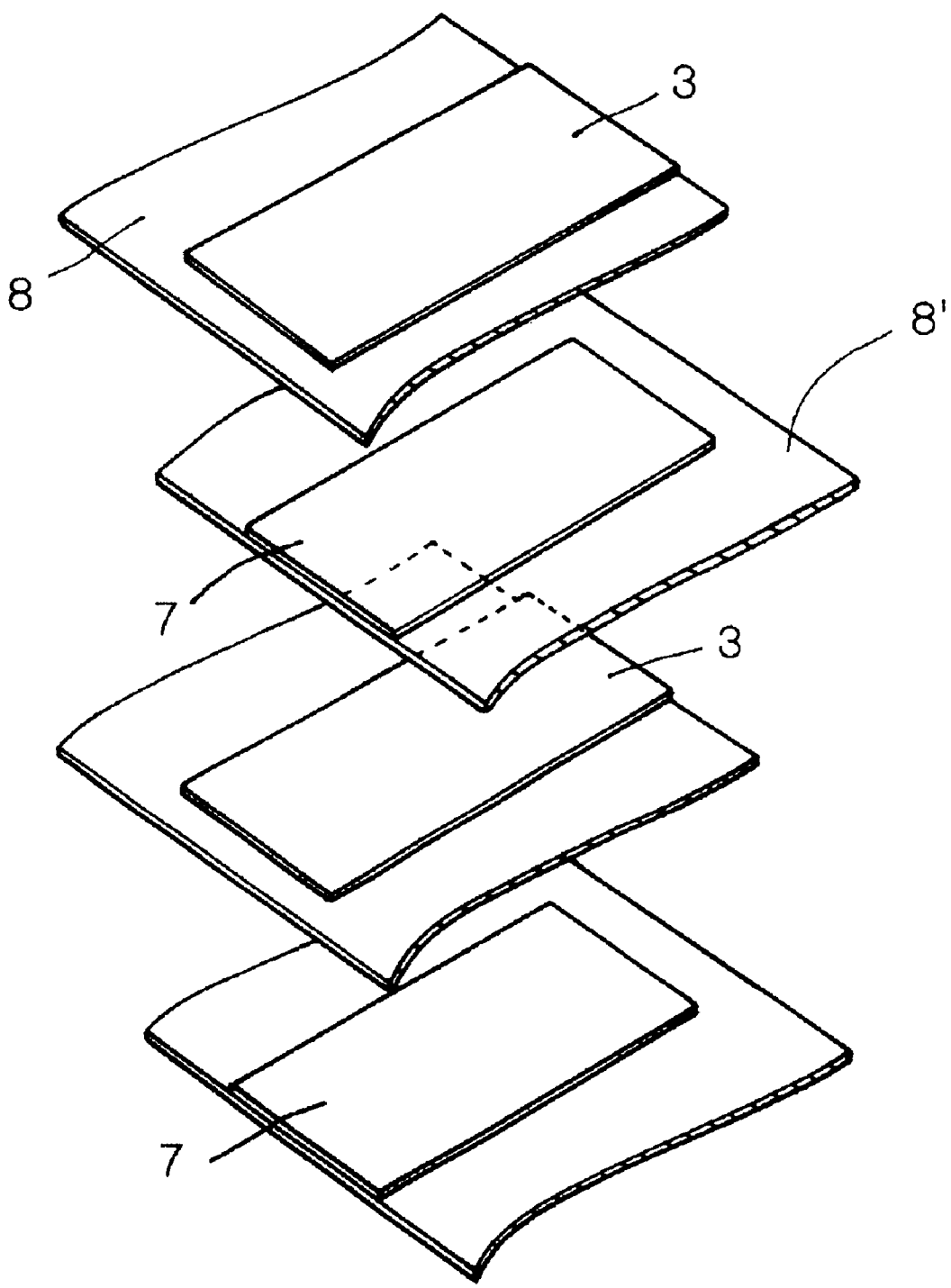
FIG. 2 shows a perspective view of the Piezoelectric Transformer in accordance with the present invention in FIG. 1.

FIG. 2 shows a perspective view of the modified Piezoelectric Transformer as shown in FIG. 1. The piezoelectric transformer is made by multi-layering first piezo-sheet 8 printing the input electrode 3 on the surface and second piezo-sheet 8' printing the common electrode 7 on the surface in turns. The input electrodes 3 on first piezo-sheet 8 is connected each other and the common electrode 7s on second piezo-sheet 8' is connected each other.

Figure 3:
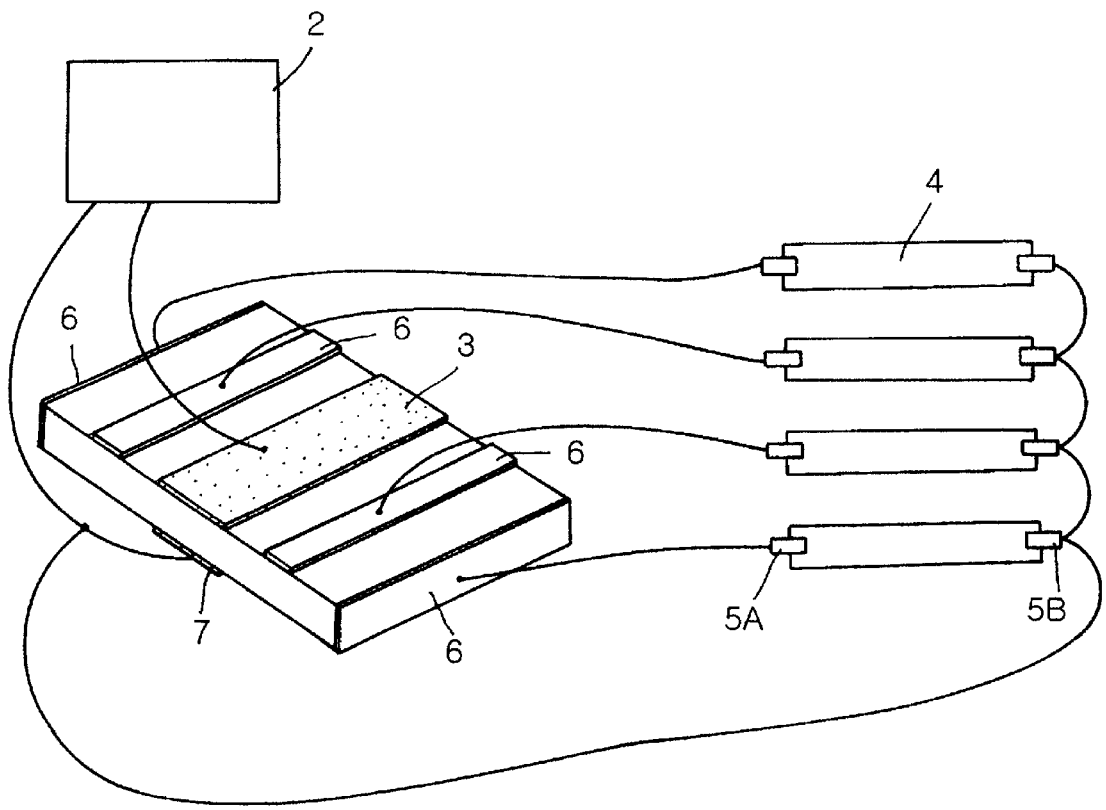
FIG. 3 shows a perspective view of a Rosen type Piezoelectric Transformer in accordance with another embodiment of the present invention and a stabilizer for lighting four lamps.
Figure 4:
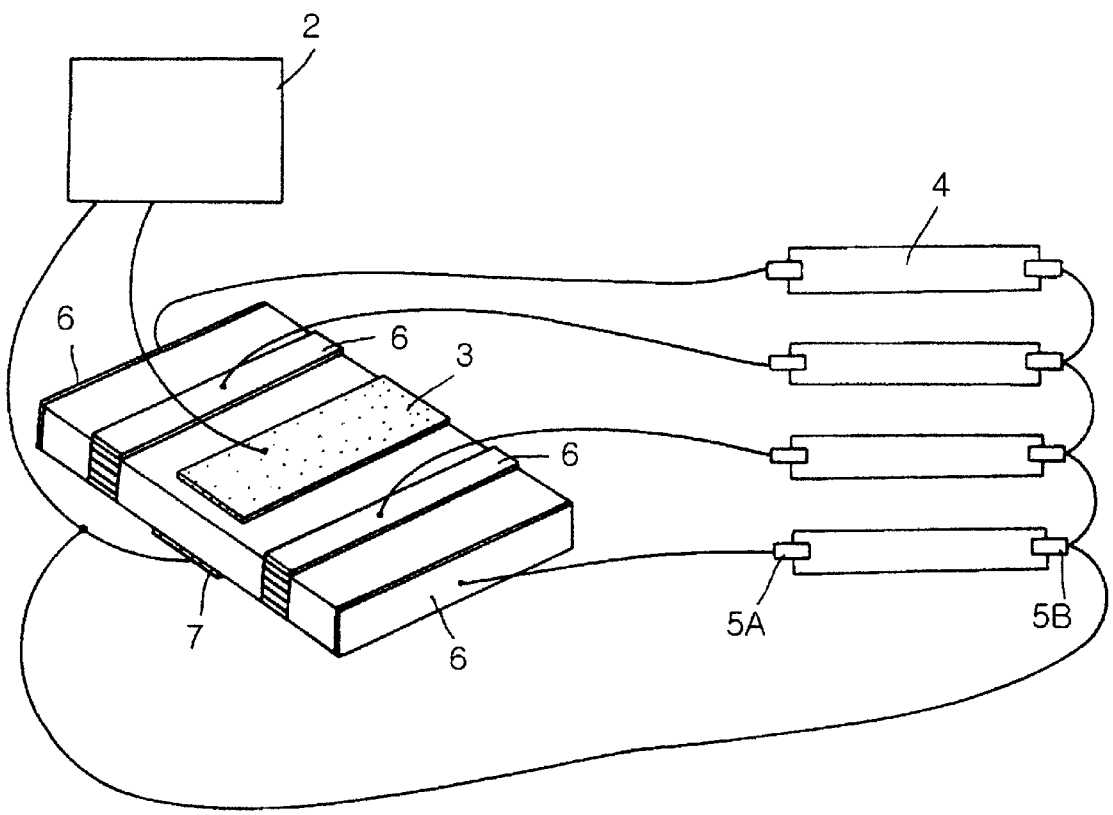
FIG. 4 shows a perspective view of the modified Piezoelectric Transformer as shown in FIG. 3.

FIGS. 3 and 4 show perspective views of a Piezoelectric Transformer in accordance with an embodiment of the present invention and a stabilizer for 4 light sources applying that.

As shown in the drawings, the piezoelectric transformer has an input electrode 3 formed at the center of the upper surface of the piezoelectric plate 1 in the direction of its width.

In multi-layer type, the input electrode 3 and the output electrodes 6 is formed on the surface of a piezo-sheet. The input electrode 3 is connected to the circuit section 2.

And, Four output electrodes 6 is formed to the positions divided into equal distance on the upper surface and the both confronting side surface in longitudinal direction. And the common electrode 7 is formed on a the bottom surface of the piezoelectric plate 1 opposed to the input electrode 3.

Figure 5:
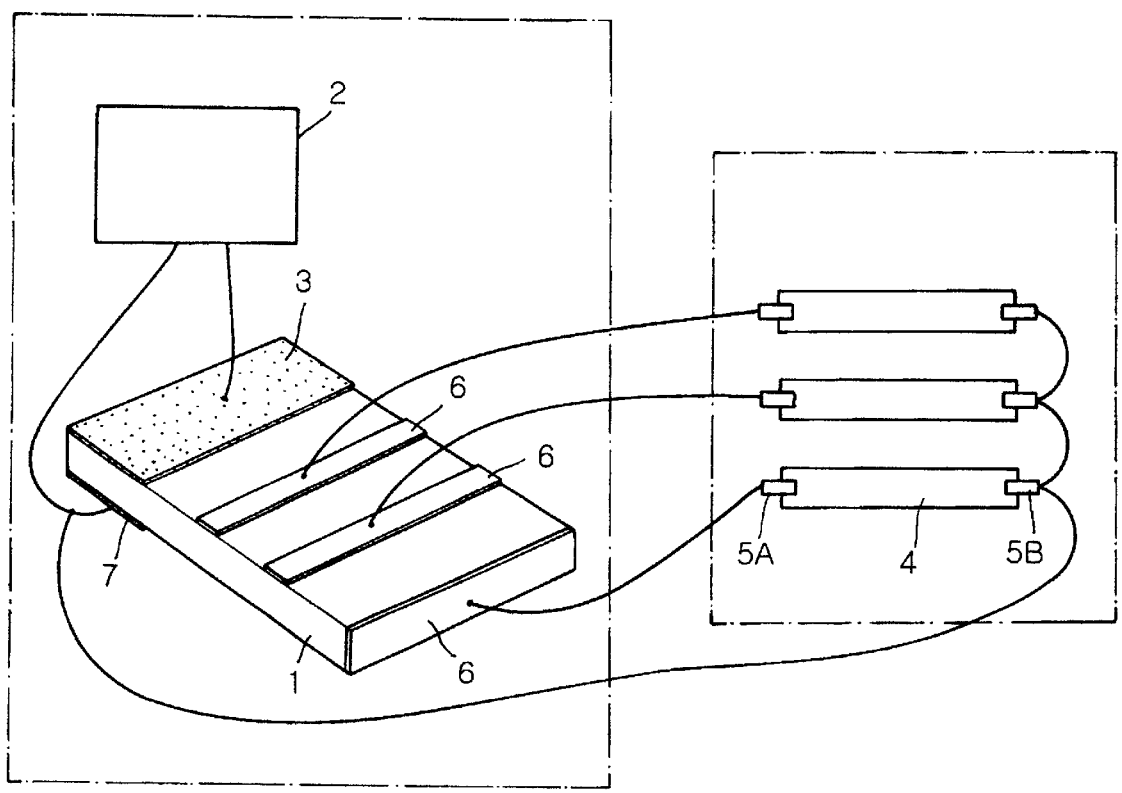
Figure 6:
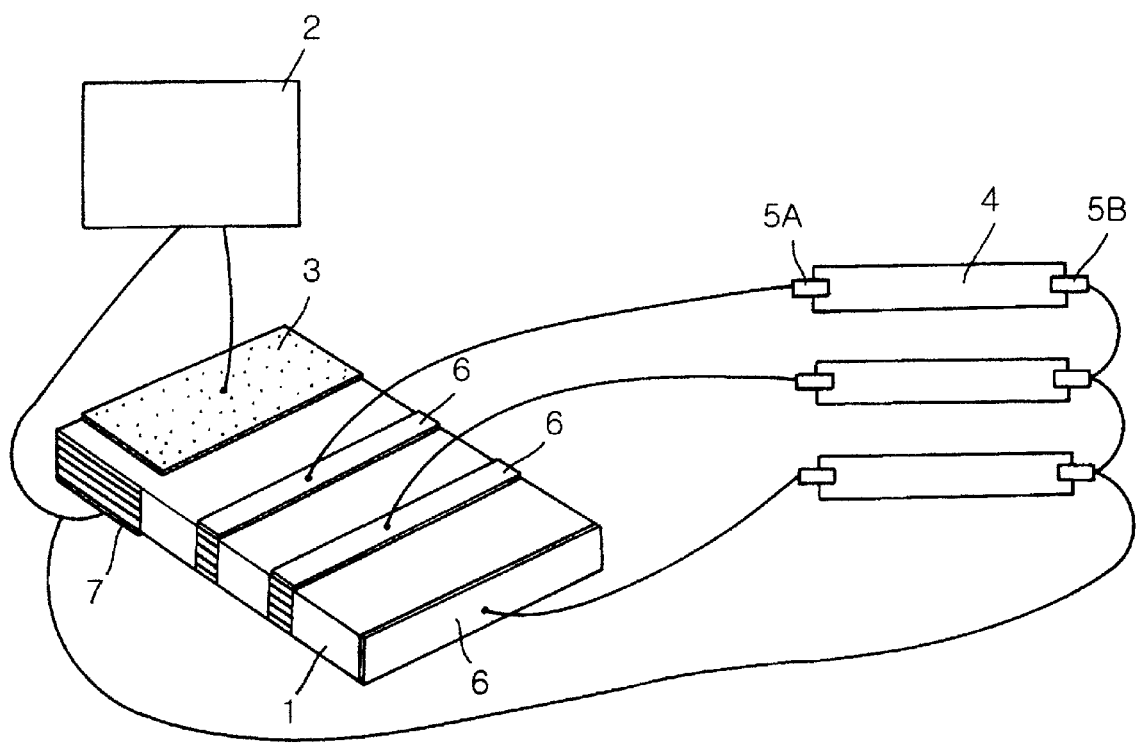
FIG. 6 shows a perspective view of the modified Piezoelectric Transformer as shown in FIG. 5.
Figure 7:
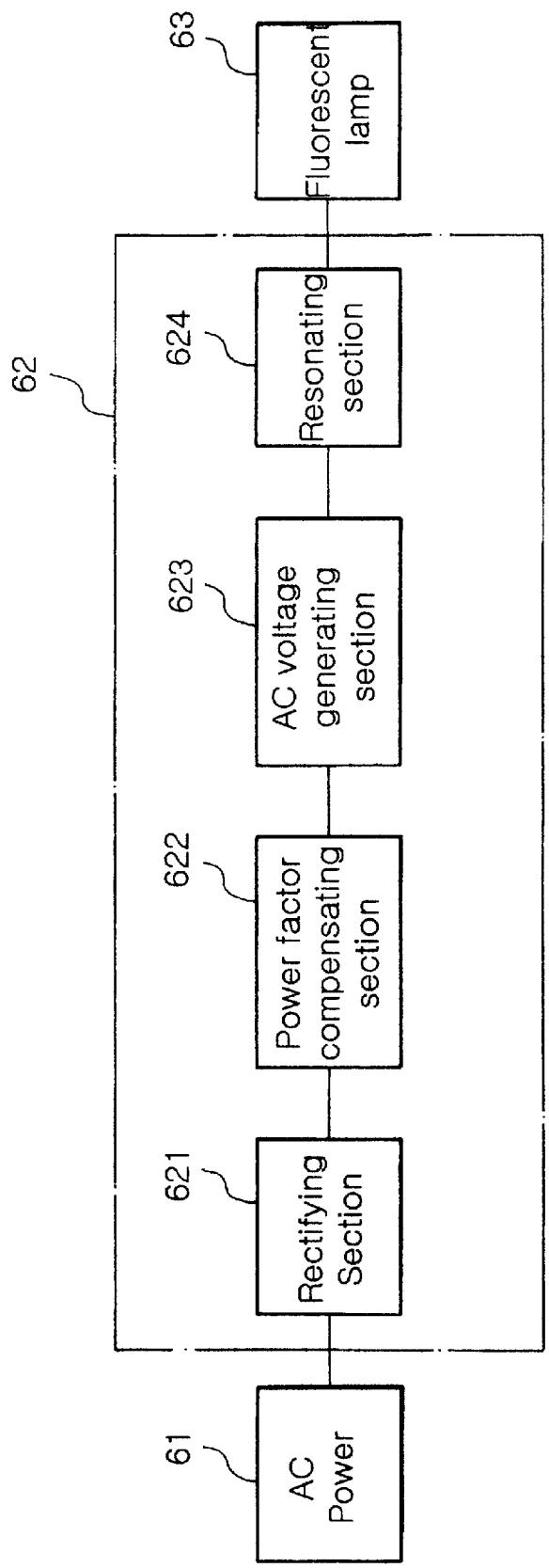
FIG. 7 shows a block diagram of a conventional fluorescent lamp stabilizer.
Figure 8:
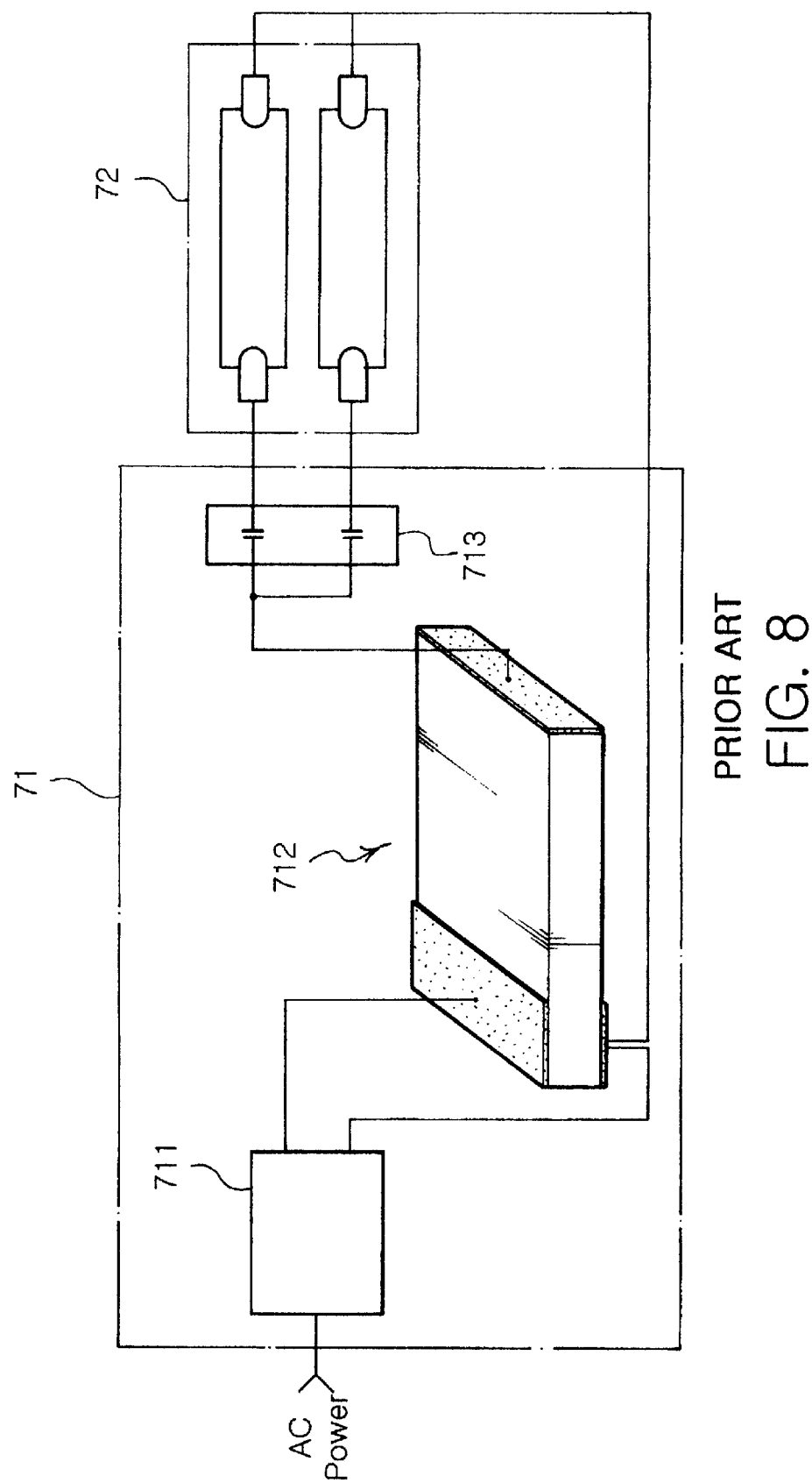
FIG. 8 shows a perspective view of a stabilizer for a plurality of lamps applying a conventional winding type piezoelectric transformer.
Figure 9:
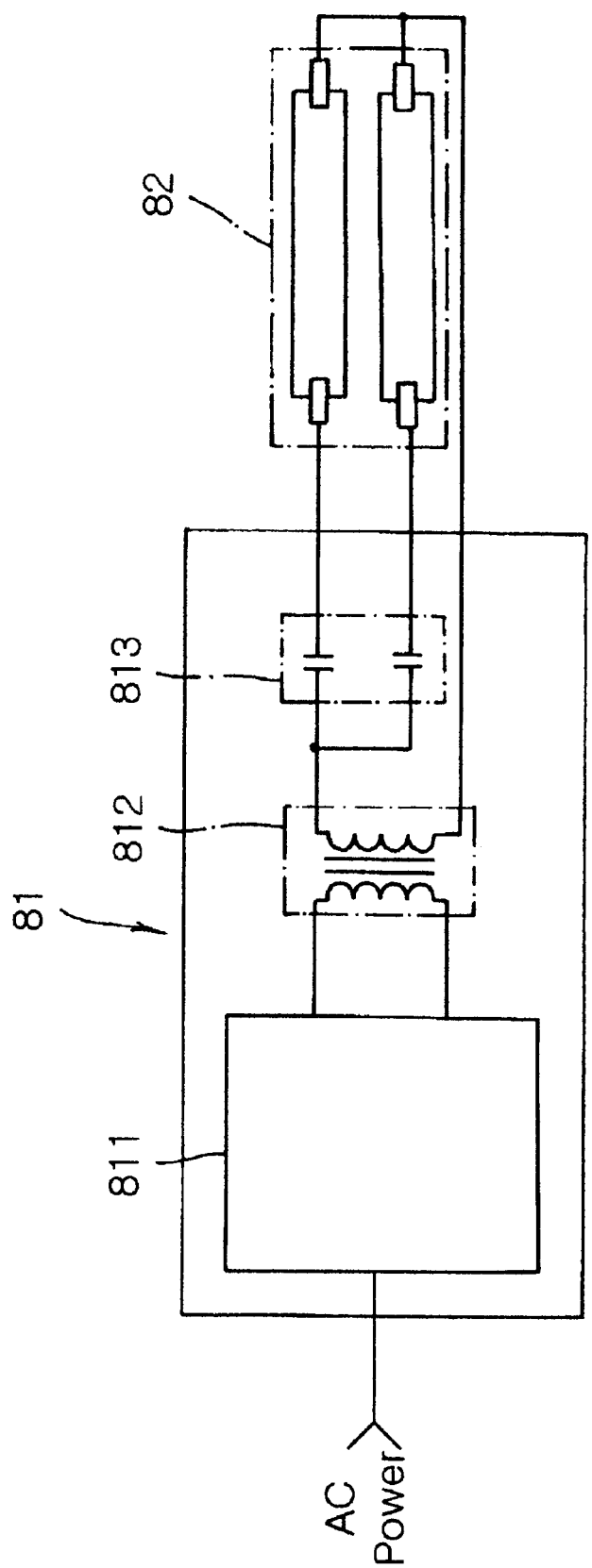
FIG. 9 shows a perspective view of a stabilizer for a plurality of lamps applying a conventional piezoelectric transformer.

The input electrode 3 is connected to the output of generating AC voltage of the circuit section 2. The four output electrodes 6 are connected to the one ends 5A of the cold cathode fluorescent lamps 4. And the other ends 5B of the cold cathode fluorescent lamps 4 and the ground of the circuit section 2 are connected to the common electrode 7. Additionally, FIGS. 5 and 6 show perspective views of a piezoelectric transformer in accordance with another embodiment of the present invention. In FIG. 5, an input electrode 3 is formed at one end of the upper surface of the plate 1 in the longitudinal direction of the piezoelectric plate 1, and connected to the circuit section 2. The output electrodes 6 is formed on a side surface of the piezoelectric plate 1 in a direction of thickness of the plate and is formed on a upper surface in a band shape, being arranged in an equal distance. And, the common electrode 7 is formed on the bottom surface of the piezoelectric plate 1 opposed to the input electrode 3 and is connected to the AC voltage generator 2 and the other ends 5B of the plurality of the cold cathode fluorescent lamps 4 at the same time.

In FIG. 6, the input electrode 3 connected to the circuit section 2 and the output electrodes 6 is formed on the surface of a piezo-sheet, and the common electrode 7 is formed on the surface of the other piezo-sheet. And a piezo-sheet formed the input electrode 3 and output electrods 6, and the other piezo-sheet formed the common electrode 7 is layered in turns.

The operational effect of the present invention will be described herein below.

In order to satisfy restricting the noise, lowering the spending power, making the device miniaturization, and the like, a piezoelectric transformer having the piezoelectric effect is used.

The basic principle of the piezoelectric transformer is the following. A deformation of another section of the piezoelectric transformer is generated due to a deformation generated by impressing a voltage to one section of the piezoelectric transformer, and a second voltage is then generated on another section. The principle above is applied to the Rosen type, which is the simplest type.

A piezoelectric plate is formed by stacking a plurality of sheets to which internal electrodes is printed in some patterns and stacked, an external input electrode is formed on one longitudinal side of upper and bottom surface of the piezoelectric plate, and an output electrode is formed at a confronting position of the input section on the side of the piezoelectric plate.

If the voltage having resonance frequency is impressed to the external output electrode, a longitudinal vibration mode is generated in the internal electrode, and the longitudinal vibration is generated in the output electrode formed on the side surface of the piezoelectric plate by the generated longitudinal vibration mode, and the voltage is generated in the output electrode as a piezoelectric effect occurred by the produced stress. And then the voltages of the output terminal rise.

As shown in the FIGS. 1 and 2, the input electrode 3 and the common electrode 7 formed on the upper and bottom surface of the piezoelectric plate 1 are connected to the AC voltage generator 2. If a voltage having a resonance frequency from the AC voltage generator 2 is supplied to the input electrode 3 and the common electrode 7, the output electrode 6 formed on both side of the piezoelectric plate 1 vibrates is generated in a direction of length by longitudinal vibration mode.

A voltage is applied to the output electrode 6 by the piezoelectric effect produced by the stress of the piezoelectric plate 1, and a high voltage is impressed on the cold cathode fluorescent lamp 4 connected through the terminal 5A.

And the same voltage is impressed through the common electrode 7 placed in the bottom surface of the piezoelectric plate 1, which is formed at confronting position of the input electrode 3, and the common electrode 7 is connected to the AC voltage generator 2 and the other terminals 5B of a plurality of the cold cathode fluorescent lamps 4 such that the cold cathode lamp 4 is impressed a high voltage.

In addition, as shown in the FIGS. 3 and 4, the resonance frequency is impressed by means of inputting the input electrode 3 and the common electrode 7 placed in the upper and bottom surface of the piezoelectric plate 1 or made from stacking into the AC voltage generator 2. Then the longitudinal vibration mode occurs in the internal section, and this makes the longitudinal vibration in the direction of length of the multiple output electrodes 6 placed on the both surface of the piezoelectric plate 1 and the surface of the input electrode 3.

A voltage is applied to the output electrode 6 by the piezoelectric effect produced by the stress, and boosting is produced to impress high voltage on the cold cathode fluorescent lamp 4 connected through the terminal 5A.

And the same voltage is impressed through the common electrode 7 placed on the bottom surface of the piezoelectric plate 1, which is formed at confronting position of the input electrode 3, and the common electrode 7 is connected to the AC voltage generator 2 and the other terminals 5B of a plurality of the cold cathode fluorescent lamps 4 such that the cold cathode lamp 4 is impressed a high voltage.

Accordingly, it is possible to reduce the number of the components and minimize the size of the inverter by using the piezoelectric transformer with multiple outputs of the present invention, and this removes the retraction of designing and the needs of installation of high internal voltage condenser, an additional grounding equipment is also unnecessary.

Accordingly, it is possible to generate a multiple output voltage having an uniform output property by using the multiple output electrodes. Thus, by providing a cold cathode fluorescent lamp using the piezoelectric transformer with multiple outputs, a easy working and a cost savings may be realized without an additional ballast capacitor.

Finally, by minimizing a volume of stabilizer, a design restriction of the stabilizer may be lower, and it is not necessary to design about the isolation additionally.

In addition, multiple outputs are easily obtained by applying the piezoelectric transformer of the present invention and various vibration modes (including length type, width type, area type, radial type, ring type vibration mode, and the like) to a power converting circuit (for example, DC-DC converter, AC-DC converter, DC-AC converter) transmitting a power.

Although various embodiments of this invention have been shown and described, it should be understood that variations, modifications and substitutions, as well as rearrangements and combinations of the preceding embodiments can be made by those skilled in the art without departing from the novel spirit and scope of this invention.

What is claimed is:

1. A stabilizer for multiple light sources, using a Rosen type Piezoelectric Transformer with multiple output electrodes, comprising:

a rectifying section rectifying AC commercial electric power source to DC electric power;

a power factor compensation section compensating the power factor caused by the fluctuation of the voltage of AC commercial electric power source so as to maintain the voltage of DC electric power generated from the rectifying section in uniform level;

AC voltage generating section converting the DC power inputted from the power factor compensation section to AC electric power having a predetermined frequency; and a Rosen type Piezoelectric Transformer with multiple output electrodes having a identical band shape, wherein the output electrodes is arranged in parallel to a input electrode, have an equal distance between neighboring electrodes, are electrically connected to a plurality of cold cathode fluorescent lamps respectively;

whereby identical voltages are applied simultaneously to a plurality of fluorescent lamps.

* * * * *